United States Patent [19]

Suzuki

[11] 3,887,884

[45] June 3, 1975

[54] RELAXATION OSCILLATOR

[75] Inventor: Takeshi Suzuki, Okazaki, Japan

[73] Assignee: Minolta Camera Kabushiki Kaisha, Japan

[22] Filed: Mar. 19, 1973

[21] Appl. No.: 342,390

[30] Foreign Application Priority Data

Mar. 17, 1972 Japan .............................. 47-32865

[52] U.S. Cl. .............. 331/111; 307/252 F; 307/301

[51] Int. Cl. .............................................. H03k 4/48

[58] Field of Search ................ 307/301, 252 F, 283; 331/111

[56] References Cited

UNITED STATES PATENTS

| | | | |
|---|---|---|---|
| 3,225,310 | 12/1965 | Stratton et al. | 331/111 |
| 3,263,093 | 7/1966 | Erdmann | 331/111 |
| 3,296,556 | 1/1967 | Schaefer | 331/111 |
| 3,526,853 | 9/1970 | Vittoz | 331/113 |

OTHER PUBLICATIONS

Radio-Electronics, R. W. Fox, pages 50-53, Oct. 1970.

*Primary Examiner*—John Kominski
*Attorney, Agent, or Firm*—Craig & Antonelli

[57] ABSTRACT

The frequency variation range of a relaxation oscillator utilizing a programmable unijunction transistor can be widened by feeding the gate of the programmable unijunction transistor with current derived from the emitter of a bi-polar transistor. No wasteful increase of current takes place with this improvement.

2 Claims, 4 Drawing Figures

RELAXATION OSCILLATOR

BACKGROUND OF THE INVENTION

This invention relates to an improvement in a relaxation oscillator utilizing a thyristor of the type having an N-type anode-voltage-current characteristic, for instance, a programmable unijunction transistor (hereinafter referred to as a PUT device), such as developed by General Electric Company, Syracuse, New York.

A known relaxation oscillator utilizing a thyristor of the N-type characteristic, for instance, the PUT device, is generally constituted as shown in FIG. 1, wherein a variable resistor VR and a capacitor C form a time constant circuit to apply the charge voltage of the capacitor C to the anode of the PUT device. R1, R2 and R3 designate resistances and Vo designates a D.C. power source. The oscillation frequency can be varied by varying the resistance of the variable resistor VR.

The operation of the relaxation oscillator of FIG. 1 is as follows: The capacitor C is charged up through the resistor VR. When the voltage of the anode *a* of the PUT device exceeds that of the gate *g* by a specified voltage (generally 0.6 volt), the PUT device turns on, thereby discharging the electric charge of the capacitor C through the resistor R3. As a result of the discharging, the voltage at the anode *a* drops and the PUT device is then turned off when its anode voltage becomes lower than the gate voltage by a specified value. Accordingly, the capacitor C begins to be charged up again. By repeating the above-mentioned operations, a relaxation oscillation is produced by this circuit. The oscillation output can be taken out, for instance, across the resistor R3. The frequency of the relaxation oscillation is mainly divided by the time constant of the time constant circuit consisting of the capacitor C and the variable resistor VR, and accordingly, the oscillation frequency can be varied by varying the resistance of the variable resistor VR. However, excessively high and low resistances of the variable resistor VR prohibits the oscillation. Thus, the ratio between the highest frequency and the lowest frequency of a range of frequency variation can be only below 100.

According to Thevenin's theorem, the circuit of FIG. 1 can be represented by the equivalent circuit shown in FIG. 2, wherein voltage V*s* of a voltage source Vs and resistance R*g* of the gate resistor R*g* of the PUT device have values as follows:

$$Vs = R2/R1 + R2 \cdot Vo \qquad 1$$

$$Rg + R1 \cdot R2/R1 + R2 \qquad 2$$

wherein R1 and R2 are the resistances of the resistors R1 and R2 of FIG. 1, respectively, and Vo is the voltage of the D.C. power source of FIG. 1.

The anode current Ia and the anode-cathode voltage V*a* of the PUT device has an N-shaped characteristic curve, as shown in FIG. 3, wherein the abscissa indicates the anode current I*a* and the ordinate indicates the anode-cathode voltage V*a*, and an oblique straight line *d–e* indicates a load curve of the variable resistor VR. The relaxation oscillator circuit oscillates when the load curve *d–e* crosses the N-shaped characteristic curve in its negative resistance part *m–n*. Consequently, in order to ensure oscillation, the resistance of the variable resistor VR must be in a certain limited range. Due to such limitation the above-mentioned high-to-low frequency ratio must be below 100.

Therefore, in order to increase the above-mentioned ratio, it is necessary to extend the negative-resistance part *m–n* as long as possible.

An improvement results from inserting a diode between the gate *g* and the constant-voltage-point of the voltage dividing network (R1 and R2) in FIG. 1, as has been proposed already in FIG. 9 in a paper entitled "D13T–A Programmable Unijunction Transistor" by W. R. Spofford, Jr., Application Engineering, Syracuse, N.Y., in the "Application Note" published by Semiconductor Products Depart. of General Electric Company, of U.S.A. However, this improvement results only in movement of the left end *m* of the negative-resistance portion of the characteristic curve leftwards. Accordingly, no prominent extension of the part *m–n* is attainable thereby.

Moving the right end *n* of the negative-resistance part can be attained by decreasing the resistance R1 of FIG. 1, i.e., the resistance between the anode and the positive end of source thereby reducing the resistance of gate resistor Rg of the equivalent circuit of FIG. 2. However, a decrease of the value of resistor R1 requires a decrease of the resistance R2, and causes an increase of the current flowing therethrough, and thus the current flows wastefully even during the cut-off condition of the PUT device.

SUMMARY OF THE INVENTION

This invention purports to provide an improved relaxation oscillator including a thyristor having an N-shaped characteristic, wherein the ratio between the highest and lowest oscillation frequencies is prominently larger than the conventional thyristor oscillator, while almost no wasteful current flows during the cut-off time of the PUT device.

DETAILED DESCRIPTION OF THE INVENTION

Figure 4:
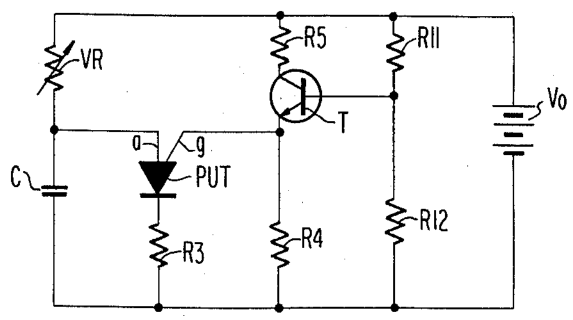
FIG. 4 is a schematic circuit diagram of a relaxation oscillator of the present invention.

Referring to FIG. 4, a variable resistor *V*r is connected between the positive end of a D.C. power source V*o* and the anode *a* of a thyristor having an N-shaped characteristic, for example, a PUT device, while a capacitor C is connected between the anode of the PUT device and the negative end of the power source V*o*. The cathode of the PUT device is connected to the negative end of the power source V*o* through a cathode resistor R3. The gate *g* of the PUT device is connected to the emitter of a bi-polar type transistor T (hereinafter referred to simply as "transistor T"). The collector of the transistor T is connected to the positive end of the power source V*o* through a resistor R5 of several kilo-ohms and the emitter is connected to the negative end of the power source V*o* through a resistor R4 of several mega-ohms. The base of the transistor T is connected to the positive side of the power source Vo through a resistor R11 of several mega-ohms and is also connected to the negative end of the power source Vo through a resistor R12 of several mega-ohms.

During the charging of the capacitor C, the potential at the anode *a* of the PUT device is lower than that of the gate *g*, and therefore, the PUT device is non-conductive. Due to the non-conduction of the PUT device, the emitter potential of the transistor T is cut off.

Figure 1:
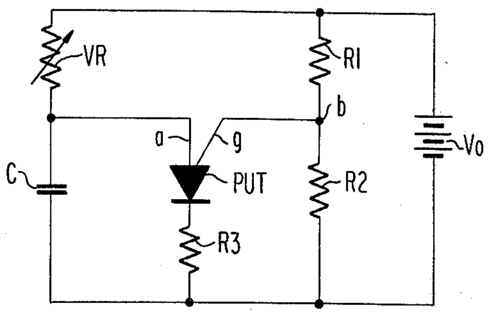
FIG.1 PRIOR ART
FIG. 1 is a schematic circuit diagram of the conventional relaxation oscillator including a PUT device.
Figure 2:
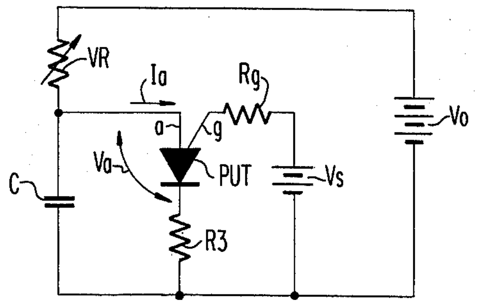
FIG. 2 is an equivalent circuit diagram for the circuit of FIG. 1.
Figure 3:
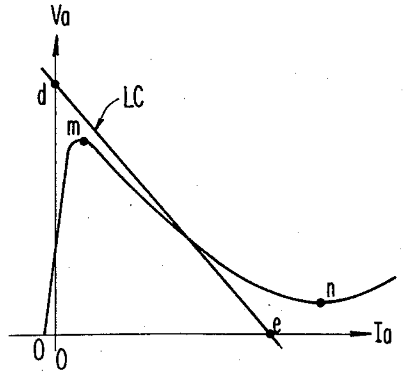
FIG. 3 is a graph indicating the characteristic curve of the PUT device, and the load curve thereof.

When the anode potential of the PUT device rises and exceeds the potential of the gate by a specified voltage (usually 0.6 volt), when the PUT device becomes conductive, and therefore, the potential of the emitter of transistor T becomes low, turning the transistor T ON. Due to the ON state of the transistor T, the gate is now connected to the positive terminal of the power source Vo through the resistor R5 of only several kilo-ohms. Thus, the condition for moving rightwards the right end *n* of the curve in FIG. 3, namely, the condition that the resistance between the anode *a* and the positive end of the source is small or that the resistor Rg of FIG. 2 is small, is attainable by the provision of the transistor T. Since the resistors R11, R12 and R4 are very high resistances, the currents flowing through these resistors during the state when the PUT device and the transistor T are OFF are very small.

According to experiments, the ratio between the highest and lowest oscillation frequencies attains high values such as from 150 to 200. Furthermore, since there is substantially no wasteful current when the PUT device is cut off, the oscillator of the present invention is suitable for an application to such apparatus as cameras, which are driven by small drycells.

What is claimed is:

1. A relaxation oscillator comprising a D.C. power source, a programmable unijunction transistor having an N-shaped anode-voltage-current characteristic, a timer circuit including a variable resistor and a capacitor connected in series across said power source, said capacitor being connected between the anode and cathode of said programmable unijunction transistor, a second transistor having its emitter connected to the gate of said programmable unijunction transistor, the collector of said second transistor being connected through a resistance to one end of said power source, a fixed resistor connecting the emitter of said second transistor to the other end of said power source, and a voltage divider having its respective ends connected across said power source and a central point providing a divided output connected to the base of said second transistor.

2. A relaxation oscillator which comprises a programmable unijunction transistor, a capacitor connected between the anode and the cathode of the programmable unijunction transistor, a variable resistor one end of which is connected to said anode, the variable resistor and the capacitor being connected in series across both ends of a D.C. power source to form a timer circuit, the gate of the programmable unijunction transistor being connected to the emitter of a second transistor, of which, the collector is connected to one end of the power source through a first resistor, the emitter is connected to the other end of the power source through a second resistor having a resistance far greater than the first resistor, and the base is connected to the dividing point of a voltage divider composed of third and fourth resistors connected in series across the D.C. power source.

* * * * *